US006808293B2

(12) United States Patent
Watanabe et al.

(10) Patent No.: US 6,808,293 B2
(45) Date of Patent: Oct. 26, 2004

(54) LED LAMP WITH PRISMATIC COVER LENS

(75) Inventors: Kazunori Watanabe, Anan (JP); Masaru Kato, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/362,753

(22) PCT Filed: Jun. 27, 2002

(86) PCT No.: PCT/JP02/06464
§ 371 (c)(1),
(2), (4) Date: Feb. 26, 2003

(87) PCT Pub. No.: WO03/002907
PCT Pub. Date: Jan. 9, 2003

(65) Prior Publication Data
US 2004/0095768 A1 May 20, 2004

(30) Foreign Application Priority Data
Jun. 27, 2001 (JP) .................................... P 2001-195079

(51) Int. Cl.[7] ................................................. F21V 5/02
(52) U.S. Cl. ........................ 362/244; 362/240; 362/337; 362/339; 362/545
(58) Field of Search .............................. 362/3, 11, 16, 362/459, 540, 543, 544, 545, 227, 234–237, 240, 244, 257, 310, 311, 317, 326, 332, 335–337, 339, 800

(56) References Cited

U.S. PATENT DOCUMENTS

| 4,862,330 | A | * | 8/1989 | Machida et al. ............ 362/244 |
| 4,951,179 | A | * | 8/1990 | Machida ..................... 362/338 |
| 5,632,551 | A | * | 5/1997 | Roney et al. ................ 362/545 |
| 5,806,969 | A | * | 9/1998 | Rosengren .................. 362/235 |
| 5,833,355 | A | * | 11/1998 | You et al. .................... 362/244 |
| 5,896,093 | A | * | 4/1999 | Sjobom ....................... 362/244 |
| 5,947,587 | A | * | 9/1999 | Keuper et al. .............. 362/235 |

FOREIGN PATENT DOCUMENTS

| JP | 6-349307 | 12/1994 |
| JP | 2000-113385 | 4/2000 |
| JP | 2000-276693 | 10/2000 |

* cited by examiner

Primary Examiner—Sandra O'Shea
Assistant Examiner—Ismael Negron
(74) Attorney, Agent, or Firm—Wenderoth, Lind & Ponack, L.L.P.

(57) ABSTRACT

The LED lamp includes a plurality of light emitting diodes and a cover lens arranged so that light emitted by the plurality of light emitting diodes is output through the cover lens. The cover lens has a plurality of prisms including a plurality of first prisms formed on the inner surface thereof, and a direction and shape of the incident surfaces of the first prisms are set such that the first prisms output light in first luminous intensity distribution patterns that are substantially equal to each other.

12 Claims, 6 Drawing Sheets

LED LAMP WITH PRISMATIC COVER LENS

TECHNICAL FIELD

The present invention relates to an LED lamp and, particularly, to an LED lamp for a traffic signal.

BACKGROUND ART

As light emitting diodes capable of emitting light of R, G and B primary colors and light emitting diodes capable of emitting white light with high luminance have been developed, LED lamps including a plurality of light emitting diodes arranged in an array have been put in use for various applications. The LED lamp has a far higher service life than that of an incandescent lamp, and also shows a high efficiency and a high resistance against vibration. Due to these advantages, the LED lamp has been used in advertising sign boards, traffic sign boards displaying route guide or traffic information, and light source for traffic signals and large screens.

With regard to the application of the LED lamp to traffic signals, in particular, while the incandescent lamp used as the light source of the conventional traffic signal requires large reflector mirrors and color filters, the LED lamp has such advantages as the capability to emit light of a single color that eliminates the need for a color filter and the capability to emit light with some degree of directivity that eliminates the need to install a large reflector mirror.

Moreover, a traffic signal constituted from LEDs that does not need reflector mirrors and color filters also has an advantage of being free from spurious lighting which is caused by extraneous light that has entered the traffic signal and been reflected off the reflector mirror placed behind an incandescent lamp, coming out of the traffic signal through a color filter.

The LED lamp used in such a traffic signal or a sign board is usually installed at an overhead location so as to be recognized by many people from a distance. As such, the LED lamp is required to emit light with symmetrical intensity distribution in the horizontal plane but asymmetrical intensity distribution in the vertical plane so that light intensity is higher in the front field and the lower field.

As it has been made possible to increase the luminous intensity of light emitting diodes recently, it is possible to decrease the number of light emitting diodes required in an LED lamp. However, a new problem has arisen in that it is difficult to achieve planar light emission of uniform intensity with an LED lamp consisting of a small number of light emitting diodes that have high luminous intensity.

SUMMARY OF THE INVENTION

The object of the present invention is to provide an LED lamp that is capable of achieving a desired luminous intensity distribution characteristic.

The second object of the present invention is to provide an LED lamp that is capable of achieving a desired luminous intensity distribution characteristic and producing uniform planar light emission.

In order to achieve the objects described above, the LED lamp of the present invention comprises a plurality of light emitting diodes and a cover lens so that light emitted by the plurality of light emitting diodes is output through the cover lens.

The cover lens has a plurality of prisms including a plurality of first prisms formed on the inner surface thereof. The direction and shape of the incident surfaces of the first prisms are set such that the first prisms output light in first luminous intensity distribution patterns that are substantially equal to each other.

The LED lamp of the present invention that has the constitution described above can emit light from the plurality of light emitting diodes in a luminous intensity distribution pattern that corresponds to the direction and shape of the incident surfaces of the first prisms.

The LED lamp of the present invention also allows the direction in which light that is output through the first prisms emerges in the vertical plane to be set by the direction of the incident surface, and the direction in which light that is output through the first prisms diffuses in the horizontal plane to be set by the configuration of the incident plane.

The LED lamp of the present invention preferably also includes a plurality of second prisms, and the direction and shape of the incident surfaces of the second prisms are set so that the second prisms have second luminous intensity distribution patterns that are substantially equal to each other.

Since the desired luminous intensity distribution pattern of the LED lamp can be achieved by means of the first and second prisms in the constitution described above, a better luminous intensity distribution pattern that is optimized can be achieved than in the case where the luminous intensity distribution pattern is formed with the first prisms only.

This constitution allows the direction in which light that is output through the second prisms emerges in the vertical plane to be set by the direction of the incident surface, and the direction in which light that is output through the second prisms diffuses in the horizontal plane to be set by the configuration of the incident surface.

In the LED lamp of the present invention, it is preferable that the first prisms and the second prisms form a pair, and the pair of prisms are arranged on the inner surface of the cover lens according to a certain rule, thereby achieving a uniform planar light emission on the external surface of the cover lens.

In the LED lamp of the present invention, the second prisms can be formed so as to direct the light below the first prisms, which makes it possible to provide an LED lamp that is required to emit light with higher intensity in the lower portion.

Further the plurality of light emitting diodes are preferably disposed in an arrangement pattern determined according to the luminous intensity distribution pattern required of the LED lamp. Since the desired luminous intensity distribution characteristic of the LED lamp can be achieved based on the arrangement pattern of the plurality of light emitting diodes, the first luminous intensity distribution pattern and the second luminous intensity distribution pattern in the constitution described above having a better luminous intensity distribution pattern that is optimized to provide the luminous intensity distribution characteristic described above.

Also in the LED lamp of the present invention, the arrangement pattern is preferably set such that the number of light emitting diodes located below the horizontal plane that includes the central axis of the cover lens is set to 40% or less of the total number of the light emitting diodes. Thus, the LED lamp that is required to emit light with higher intensity in the lower portion can be made easily.

Also in the LED lamp of the present invention, the angle between the line that connects the light emitting diode located at the outermost position of the arrangement pattern and the periphery of the cover lens on the inner surface thereof and the central axis of the cover lens is preferably in a range from 30° to 60°. With this constitution, uniform planar light emission can be achieved on the external surface of the cover lens.

Moreover, in the LED lamp of the present invention, it is preferable that the cover lens has an external surface that is a spherical surface having a radius of curvature of 500 mm or less.

With this constitution, when the first prisms or both the first prisms and the second prisms are used, light emitted by the light source can be output more efficiently. Also, it is possible to mitigate the reflection of extraneous light on the cover lens surface, thereby preventing the contrast from decreasing when lighted.

As described above, the present invention can provide an LED lamp that is capable of achieving a desired luminous intensity distribution characteristic and producing uniform planar light emission.

DETAILED DESCRIPTION OF THE INVENTION

Preferred embodiments of the present invention will be described below with reference to the accompanying drawings.

Figure 1:
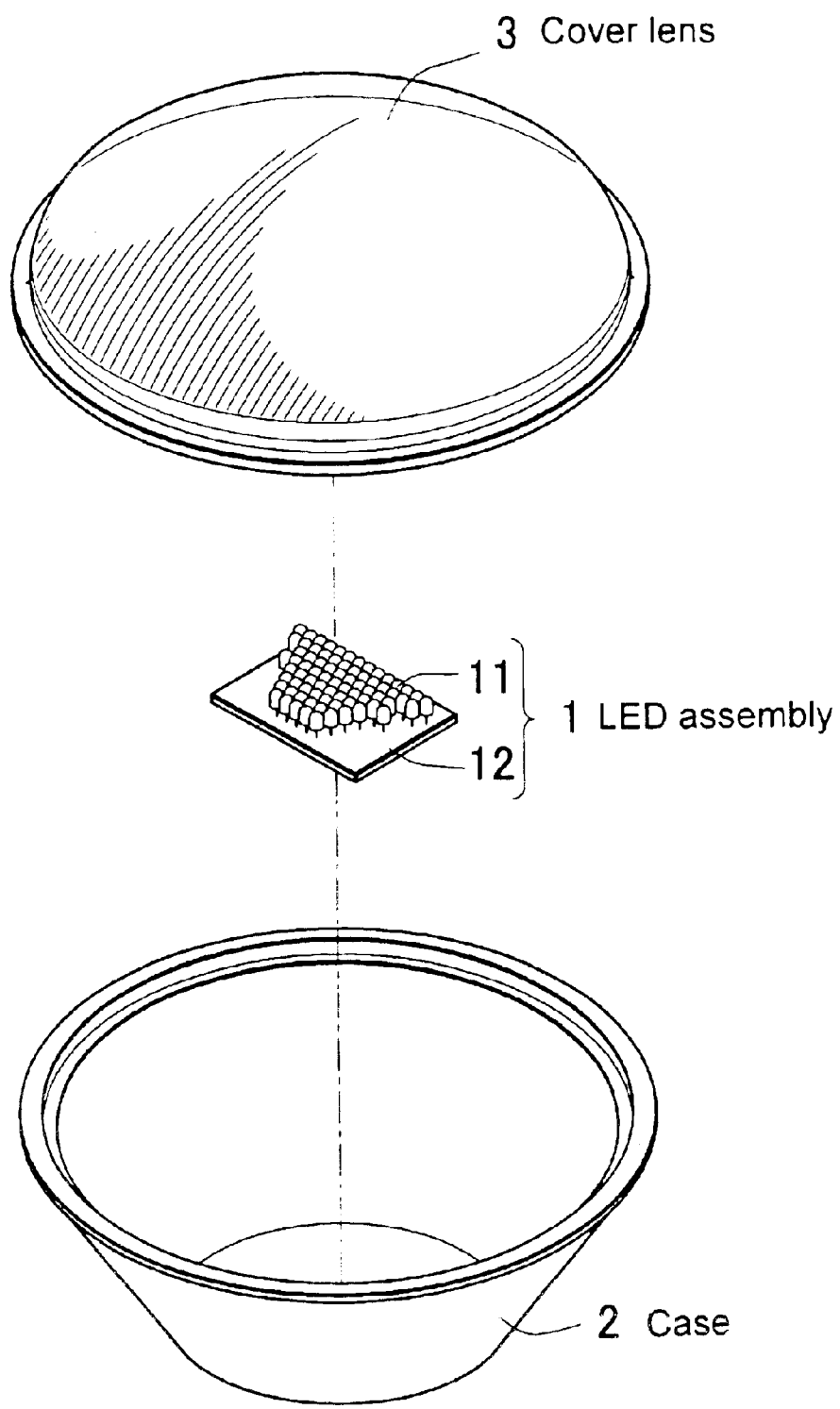
FIG. 1 is an exploded perspective view of the LED lamp according to an embodiment of the present invention.

As shown in FIG. 1, the LED lamp of this embodiment comprises a case 2 having a truncated conical shape with a circular base surface and an opening that is parallel to the base surface and has a diameter larger than that of the base surface, an LED assembly 1 that has a plurality of light emitting diodes 11 disposed on a substrate 12 which is attached to the base surface of the case 2, and a cover lens 3 attached to the opening of the case 2. Thus, light is emitted in a predetermined luminous intensity distribution pattern for an application to a traffic signal.

Figure 2:
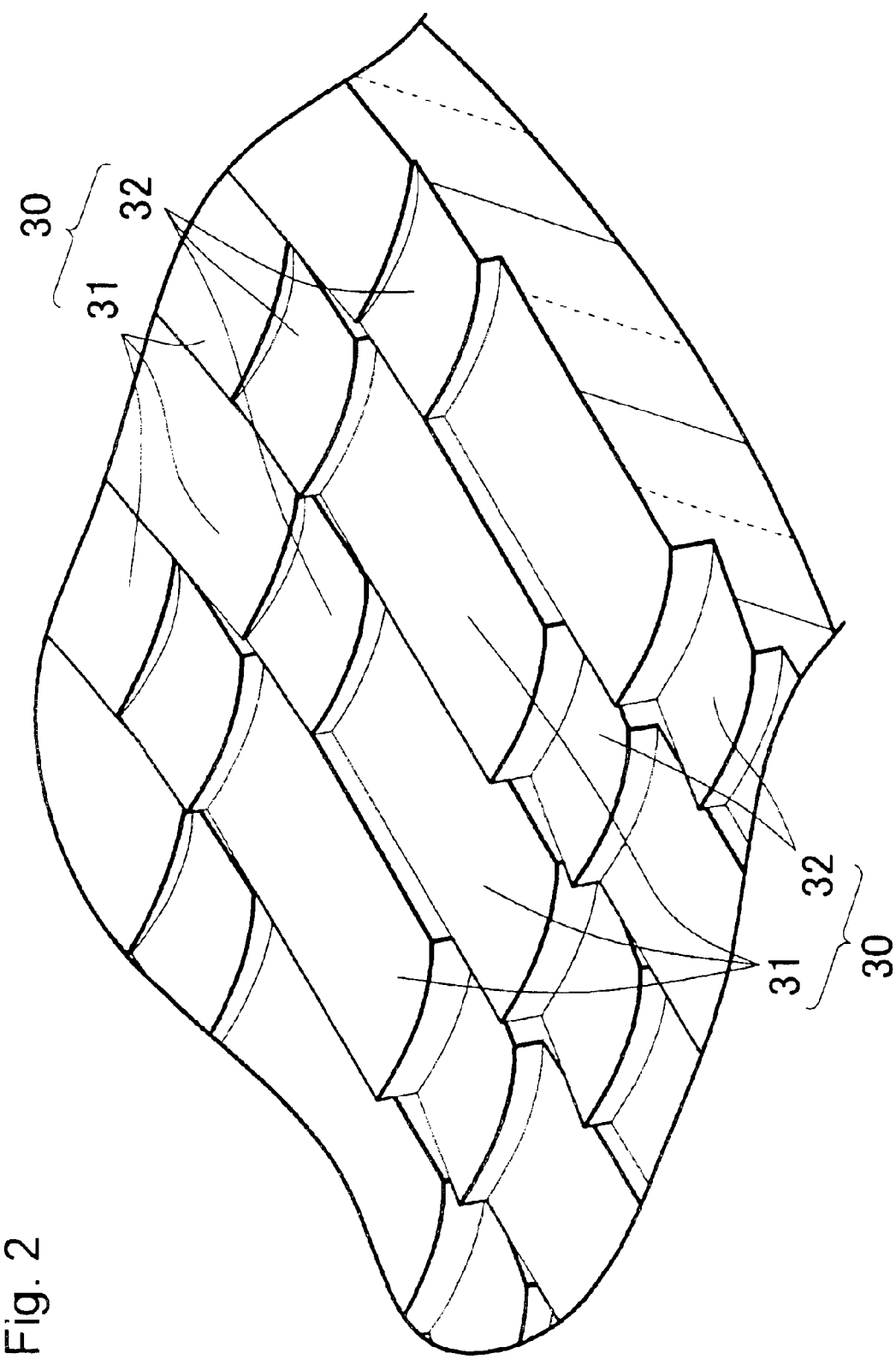
FIG. 2 is an enlarged perspective view of prisms formed on the inner surface of a cover lens according to an embodiment of the present invention.
Figure 3:
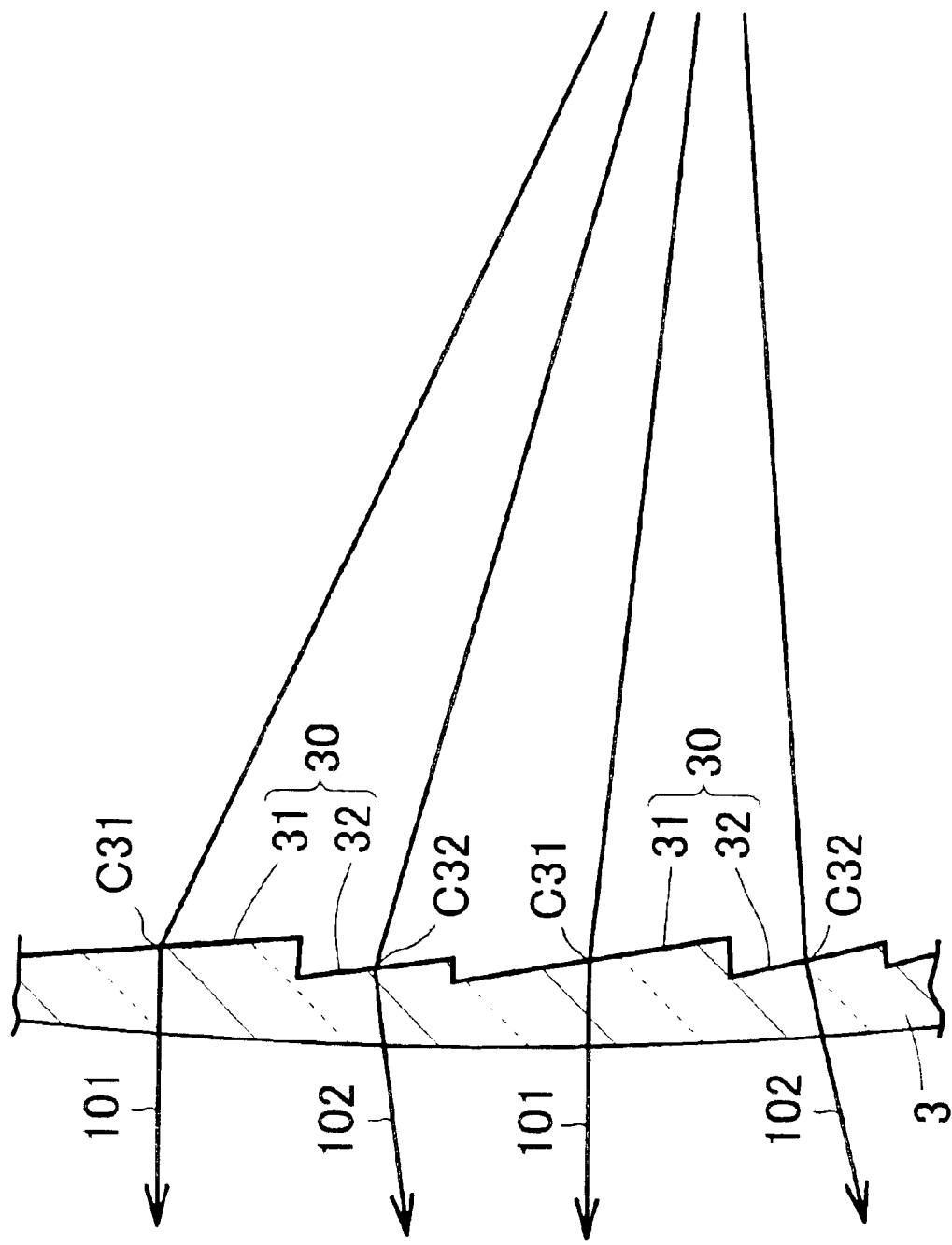
FIG. 3 is a sectional view taken along lines A-A' in FIG. 2.

For the purpose of forming the predetermined luminous intensity distribution pattern with the LED lamp of this embodiment, the cover lens 3 has a plurality of prisms 30 comprising a set of first prisms 31 and set of second prisms 32 formed on the inner surface thereof, as shown in FIGS. 2 and 3.

The direction and shape of the incident surfaces of the first prisms 31 are set so that the first prisms output light in intensity distribution patterns that are substantially equal to each other. The direction and shape of the incident surfaces of the second prisms 32 are set so that the second prisms 32 output light in intensity distribution patterns that are substantially equal to each other.

In the LED lamp of this embodiment, the configuration of the second prisms 32 is determined so as to direct light in a direction lower than that of the first prisms 31. Specifically, the cover lens 3 of the LED lamp has one luminous intensity distribution pattern (first luminous intensity distribution pattern) formed by the assembly of the plurality of first prisms 31, and another luminous intensity distribution pattern (second luminous intensity distribution pattern) formed by the assembly of the plurality of second prisms 32 so as to form a luminous intensity distribution pattern as a whole (total luminous intensity distribution pattern) through the superposition of the first and second luminous intensity distribution patterns.

In the LED assembly 1 of the LED lamp, the light emitting diodes 11 are arranged in a pattern that is determined according to the luminous intensity distribution pattern required of the LED lamp.

Thus the luminous intensity distribution pattern of the LED lamp in this embodiment is constituted by (1) the arrangement pattern of the plurality of light emitting diodes 11, (2) the assembly of the plurality of first prisms 31, and (3) the assembly of the plurality of second prisms 32.

Now construction of components and the principle of forming the luminous intensity distribution pattern in the LED lamp according to the embodiment of the present invention will be described in more detail below.

(Prisms 30)

The prisms 30 comprise a set of the first prisms 31 and a set of the second prisms 32 disposed in a regular pattern on the inner surface of the cover lens 3, as shown in FIG. 2. In this embodiment, the first prisms 31 and the second prisms 32 are arranged alternately in the vertical direction and in the horizontal direction in a regular pattern.

In this specification, taking the situation where the LED lamp is usually used into consideration, the direction in the lateral plane parallel to the central axis of the cover lens 3 is referred to as the horizontal direction, and the direction perpendicular to the horizontal plane is referred to as the vertical direction. According to this definition, the direction of line A-A' in FIG. 2 is the vertical direction. Thus, the prisms 30 comprise the first prisms 31 and the second prisms 32 that are disposed adjacent to each other in the vertical direction.

(First Prisms 31)

In this embodiment, each of the first prisms 31 has an incident surface consisting of a part of a cylindrical surface. The inclination of the incident plane of each of the first prisms 31 is set such that light that is emitted by a light source located on the central axis of the cover lens 3 (light source located at a position where the LED assembly 1 is disposed) and is incident on the first prisms 31 at the center C31 thereof emerges, after passing through the first prisms 31, in a direction parallel to the central axis of the cover lens 3 (schematically shown in FIG. 3 with reference numeral 101).

The radius and length of the circumference of the cylindrical surface that constitutes the incident surface of each of the first prisms 31 are set such that light that is incident on the first prisms 31 and has passed therethrough spreads to a predetermined extent in the horizontal plane, while the longitudinal length of the cylindrical surface that constitutes the incident surface in the direction perpendicular to the circumferential surface of the cylinder that constitutes the incident surface is set such that light that is incident on the first prisms 31 and has passed therethrough spreads to a predetermined extent in the vertical plane (plane perpendicular to the horizontal plane). The cylindrical surfaces that constitute the incident surfaces of the first prisms 31 are also formed to be substantially equal to each other.

The extent to which light incident on the incident surfaces of the first prisms 31 in the horizontal direction and in the vertical direction is set in accordance with the luminous intensity distribution pattern required of the LED lamp in order to form the luminous intensity distribution pattern required of the LED lamp. The luminous intensity distribution patterns of the first prisms 31 can be made equal to each other by forming the cylindrical surfaces that constitute the incident surfaces of the first prisms 31 substantially equal to each other and setting the inclination of the incident surface of each of the first prisms 31 such that light that is emitted by a light source located on the central axis of the cover lens 3 is incident on the first prisms 31 at the center C31 thereof and emerges therefrom in a direction parallel to the central axis of the cover lens 3. In other words, the direction and shape of the incident surfaces of the first prisms are set so that the luminous intensity distribution patterns of light emerging from the first prisms 31 are equal to each other in this embodiment.

Figure 4:
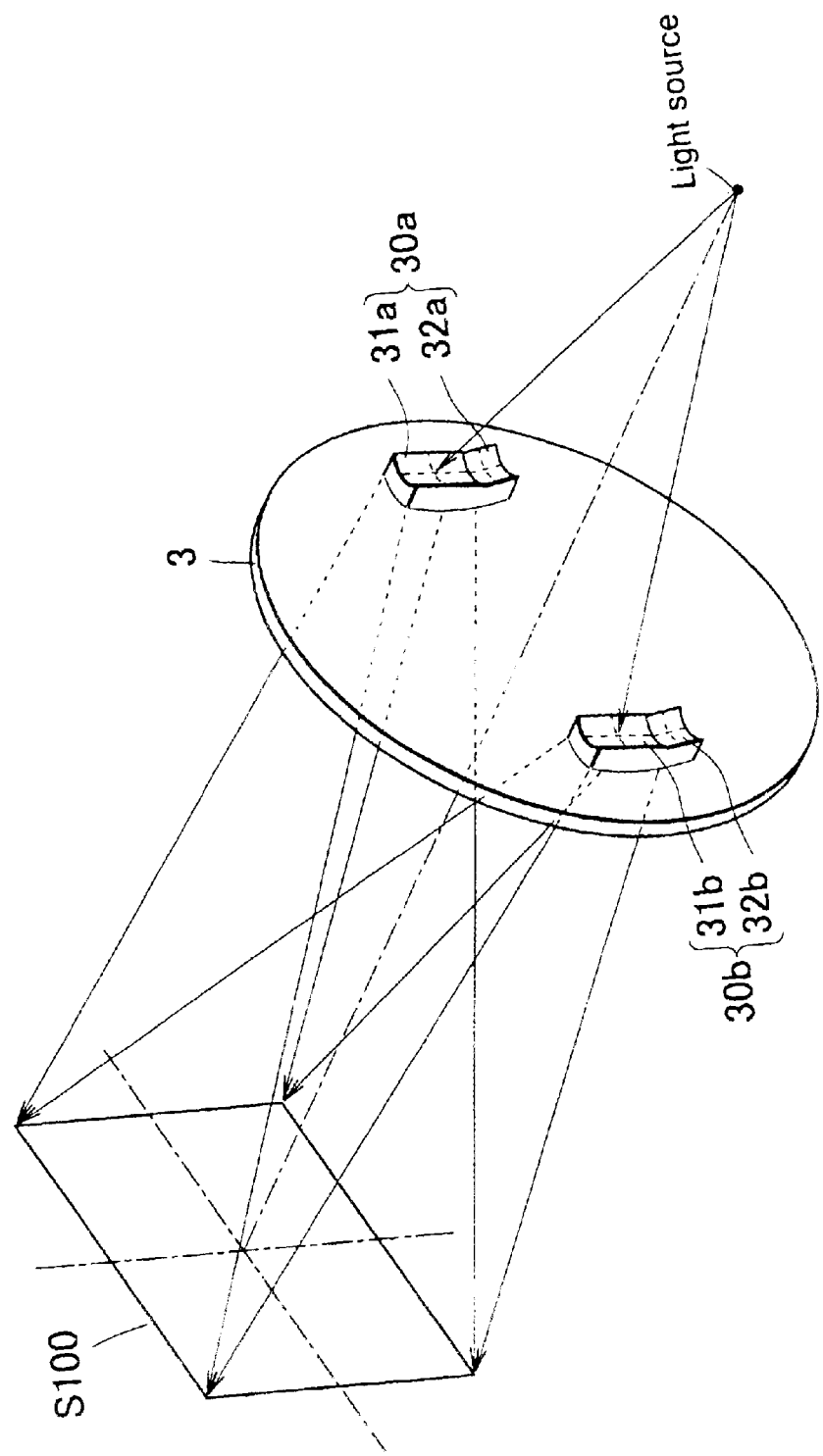
FIG. 4 schematically shows the luminous intensity distribution pattern of light output through first prisms of this embodiment.

FIG. 4 shows light emerging through first prisms 31a, 31b of two prisms 30a, 30b that are arbitrarily selected from among the plurality of prisms 30. As shown in FIG. 4, in this embodiment, the luminous intensity distribution patterns formed by the first prism 31a and the luminous intensity distribution patterns formed by the first prism 31b are formed so as to have the same extent (cover the same area) in the horizontal direction and in the vertical direction around the central axis of the cover lens 3 located at the center thereof. Meanwhile, the luminous intensity distribution patterns formed by the first prism 31a and the luminous intensity distribution patterns formed by the first prism 31b are substantially equal to each other in terms of the direction and the pattern.

Although FIG. 4 is drawn as if the patterns agree only on an imaginary screen S100 because the screen S100 that should be at a sufficiently large distance is drawn near the cover lens 3 due to the restriction of the drawing page, the actual diameter of the cover lens 3 is sufficiently smaller than the proportion shown in the drawing and the luminous intensity distribution patterns substantially agree with each other. For example, it will easily be understood that the luminous intensity distribution patterns become identical when the diameter of the cover lens 3 is made sufficiently smaller in FIG. 4.

As described above, light emitted from one light source creates one luminous intensity distribution pattern (the first luminous intensity distribution pattern) through superposition of a plurality of substantially identical luminous intensity distribution patterns that are formed by different beams emerging from the plurality of first prisms 31.

In this specification, the first luminous intensity distribution pattern formed by light that is output from one light source will be referred to as first light intensity distribution pattern of single light source, in order to distinguish it from a luminous intensity distribution pattern formed by light beams that are output from a plurality of light sources (light emitting diodes) to be described later.

(Second Prisms 32)

In this embodiment, each of the second prisms 32 has an incident surface consisting of a part of a cylindrical surface. The inclination of the incident surface of each of the second prisms 32 is set such that light that is emitted by a light source located on the central axis of the cover lens 3 and is incident on the second prisms 32 at the center C32 thereof emerges, after passing through the second prisms 32, in a direction parallel to each other and below the central axis of the cover lens 3 (schematically shown in FIG. 3 with reference numeral 102). The radius and length of the circumference of the cylindrical surface that constitutes the incident surface of each of the second prisms 32 are set such that light that is incident on the second prisms 32 and has passed therethrough spreads to a predetermined extent in the horizontal plane, while the vertical length of the cylindrical surface that constitutes the incident surface is set such that light that is incident on the second prisms 32 and has passed therethrough spreads to a predetermined extent in the vertical plane (plane perpendicular to the horizontal plane). The cylindrical surfaces that constitute the incident surfaces of the second prisms 32 are also formed to be substantially equal to each other.

The extent to which light incident on the incident surfaces of the second prisms 32 in the horizontal direction and in the vertical direction is set in accordance with the luminous intensity distribution pattern required of the LED lamp in order to form the luminous intensity distribution pattern required of the LED lamp. The luminous intensity distribution patterns of light emerging from the second prisms 32 can be made equal to each other by forming the cylindrical surfaces that constitute the incident surfaces of the second prisms 32 substantially equal to each other and setting the inclination of the incident surface of each of the second prisms 32 such that light that is incident on the second prisms 32 at the central axis C32 thereof emerges, after passing through the second prisms 32, in directions parallel to each other. In other words, the direction and shape of the incident surfaces of the second prisms are set so that the luminous intensity distribution patterns of the second prisms 32 are equal to each other.

Figure 5:
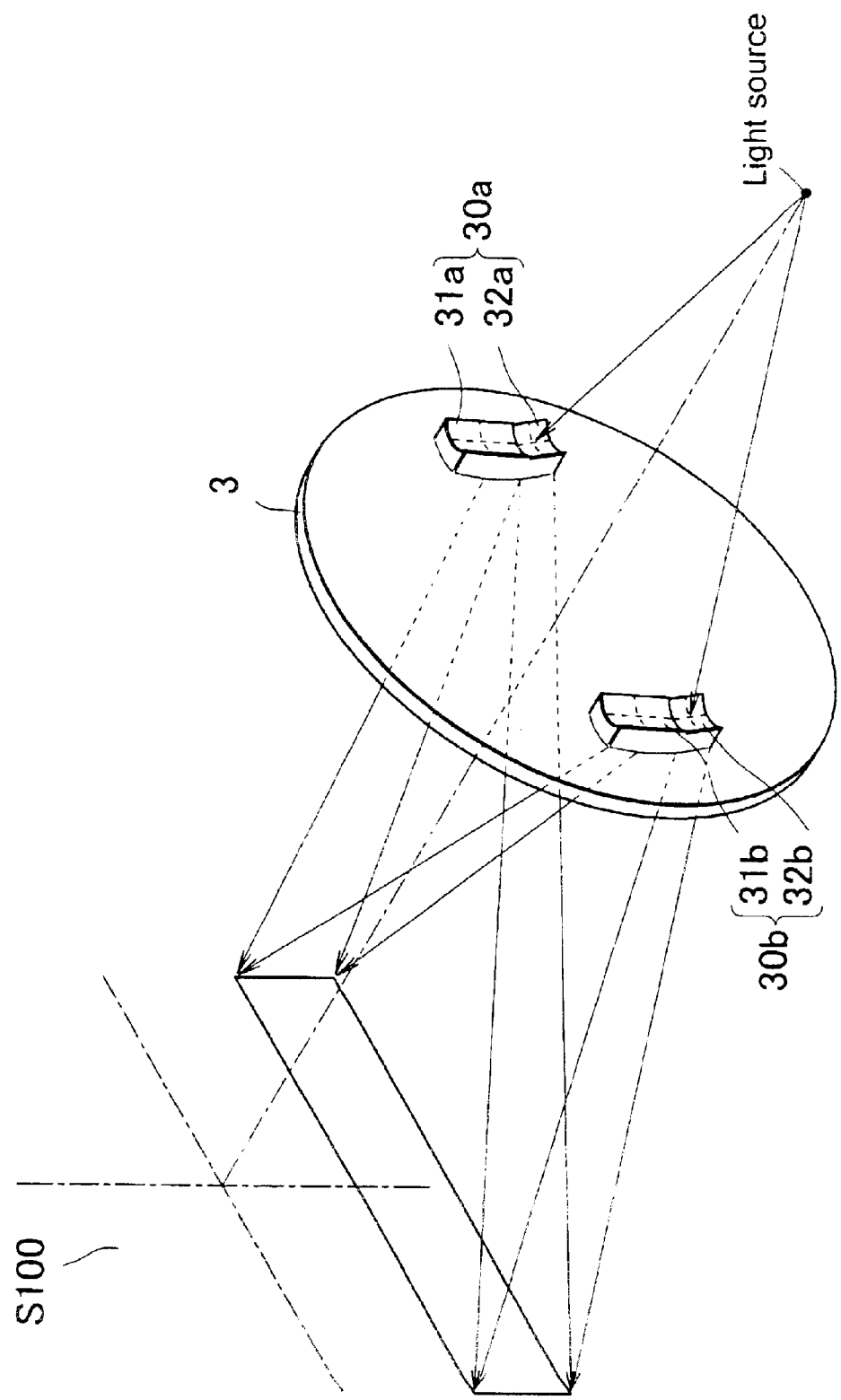
FIG. 5 schematically shows the luminous intensity distribution pattern of light output through second prisms of this embodiment.

FIG. 5 shows light emerging through second prisms 32a, 32b of the two prisms 30a, 30b that are arbitrarily selected from among the plurality of prisms 30 (i.e., the same arbitrarily selected prisms 30a, 30b shown in FIG. 4). As shown in FIG. 5, in this embodiment, the luminous intensity distribution patterns formed by the second prism 32a and the luminous intensity distribution patterns of the second prism 32b are formed so as to have the same extent (cover the same area) in the horizontal direction and in the vertical direction. Meanwhile, the luminous intensity distribution patterns formed by the second prism 32a and the luminous intensity distribution patterns formed by the second prism 32b are substantially equal to each other in terms of the direction and the pattern.

Although FIG. 5 is drawn as if the patterns agree only on the specific screen S100, this is due to the restriction of drawing paper.

It will be easily understood that, actually, the luminous intensity distribution patterns substantially agree with each other when the diameter of the cover lens 3 is made sufficiently smaller than the proportion shown in the drawing.

As described above, light emitted from one light source makes one luminous intensity distribution pattern (the second luminous intensity distribution pattern), that is different from the first luminous intensity distribution pattern, through superposition of a plurality of substantially identical luminous intensity distribution patterns that are formed by different beams emerging from the plurality of second prisms 32.

In this specification, the second luminous intensity distribution pattern formed by light that is output from one light source will be referred to as the second light intensity distribution pattern of a single light source in order to distinguish it from a luminous intensity distribution pattern formed by light beams that are output from a plurality of light sources (light emitting diodes) to be described later.

As will be understood from the above description, in this embodiment, light emitted from one light source makes a luminous intensity distribution pattern (synthesized light intensity distribution pattern of single light source) through superposition of the first light intensity distribution pattern of a single light source and the second light intensity distribution pattern of a single light source, by being output through the cover lens 3.

(LED Assembly 1)

The LED assembly 1 is formed by disposing the plurality of light emitting diodes 11 on the substrate 12 in a predetermined arrangement. In this embodiment, the arrangement pattern of the light emitting diodes 11 and the intensity of light emitted by the light emitting diodes are important elements that determine the luminous intensity distribution pattern (characteristics) of the LED lamp, along with the shape of the prism 30 and arrangement of the prisms 30.

Figure 6:
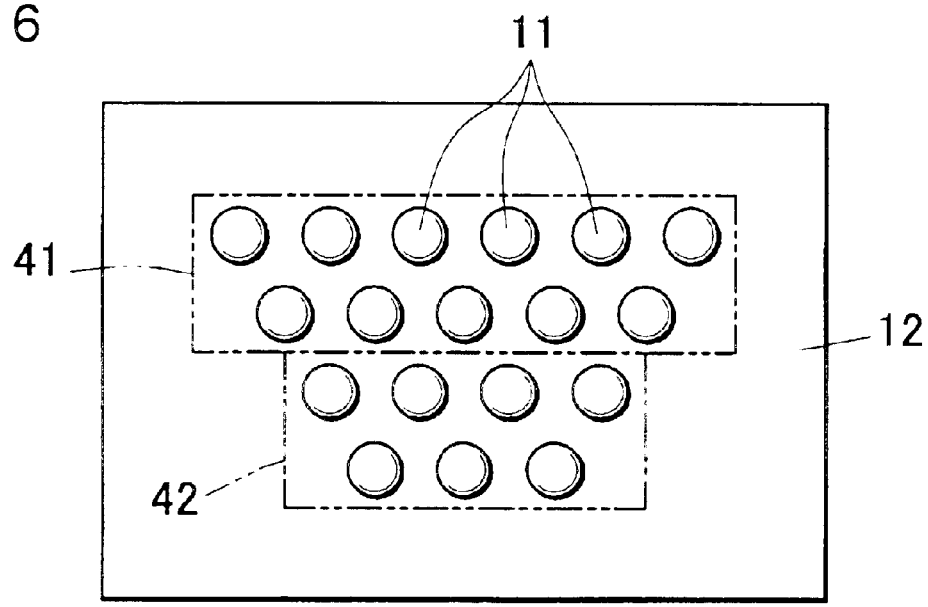
FIG. 6 is a plan view of an LED assembly 1 of this embodiment.

That is, in this embodiment, the number of light emitting diodes 11 disposed in the upper row is made larger than the number of the light emitting diodes 11 disposed in the lower row, so that the intensity of light is different between the upper and the lower portions in the light source of the plurality of light emitting diodes, as shown in FIG. 6. Since this enables the LED assembly to increase the intensity of light directed in the lower direction from the LED lamp, it is possible to easily make the LED lamp for a traffic signal that is required to direct light of higher intensity in the lower direction by combining this with the configuration of the prisms 30 of the cover lens 3 described previously. In our research, it has been confirmed that, when the LED lamp for a traffic signal is made by combining this LED arrangement with the configuration of the prisms 30 of the cover lens 3 described previously, it is preferable to set the intensity of light emitted by the light emitting dioides 11 located below the optical axis of the LED assembly 1 to 40% or less of the intensity of light emitted by the light emitting diodes 11 located above the optical axis. Thus intensity of light may be made different between the upper and lower portions either by setting the number of light emitting diodes as described above, or by changing the current drawn by the light emitting diodes or the luminance level of the light emitting diodes (Luminous Intensity Distribution Pattern Formed by Collective Light Sources and Cover Lens 3)

The luminous intensity distribution pattern of the LED lamp as a whole will be described below for a case in which the LED lamp is constituted from a combination of the LED assembly 1 comprising the light emitting diodes disposed in the arrangement pattern described previously and the cover lens 3 of the constitution described previously.

With reference to FIG. 4, the luminous intensity distribution patterns of the first prisms 31a, 31b shift downward, while maintaining the identical patterns when the light source is shifted to above the optical axis of the cover lens 3. Also in FIG. 4, the luminous intensity distribution patterns formed by the first prisms 31 (i.e., arbitrary prisms 31a, 31b) shift to the left of the optical axis while maintaining the identical patterns when the light source is shifted to the right of the optical axis of the cover lens 3. Also in FIG. 4, the luminous intensity distribution patterns formed by the first prisms 31 shift to the right of the optical axis while maintaining the identical patterns when the light source is shifted to the left of the optical axis of the cover lens 3.

Even when the light source is located at a position offset from the optical axis of the cover lens 3, the first prisms 31 have identical first light intensity distribution patterns of a single light source, while the first light intensity distribution pattern of single light source has a direction that corresponds to the position of the light source relative to the optical axis of the cover lens 3. That is, when the LED assembly 1 comprising the plurality of light emitting diodes 11 disposed in the predetermined arrangement pattern is used, the luminous intensity distribution pattern formed by the LED assembly 1 and the first prisms 31 (first light intensity distribution pattern of collective light source) is the superposition of all the first light intensity distribution patterns of single light sources formed by the individual light emitting diodes 11 and the first prisms 31.

As will be clear from the above description, since the first light intensity distribution pattern of a single light source formed by an individual light emitting diode 11 has a direction that corresponds to the position of the light emitting diode 11, the first light intensity distribution pattern of a collective light source formed as the superposition of the first light intensity distribution patterns of single light sources becomes a luminous intensity distribution pattern that corresponds to the arrangement pattern of the LED assembly 1.

When the number of light emitting diodes 11 disposed above the optical axis of the cover lens 3 is made larger than the number of the light emitting diodes 11 disposed below the optical axis, for example, the first light intensity distribution pattern of a collective light source has a light intensity distribution that is stronger in the lower portion.

Now with reference to FIG. 5, the luminous intensity distribution patterns formed by the second prisms 32a, 32b shift downward while maintaining the identical patterns when the light source is shifted above the optical axis of the cover lens 3. Also in FIG. 5, the luminous intensity distribution patterns formed by the second prisms 32 (i.e., arbitrary prisms 32a, 32b ) shift to the left of the optical axis while maintaining the identical patterns when the light source is shifted to the right of the optical axis of the cover lens 3, while the luminous intensity distribution patterns formed by the second prisms 32 shift to the right of the optical axis while maintaining the identical patterns when the light source is shifted to the left of the optical axis of the cover lens 3.

As described above, similarly to the case of the first prisms 31, even when the light source is located at a position offset from the optical axis of the cover lens 3, the second prisms 32 have identical second light intensity distribution patterns of single light sources, while the second light intensity distribution pattern of a single light source has a direction that corresponds to the position of the light source relative to the optical axis of the cover lens 3. That is, the second light intensity distribution pattern of a collective light source formed by the LED assembly 1 and the second prisms 32 is the superposition of all the second light intensity distribution patterns of single light sources and becomes a luminous intensity distribution pattern that corresponds to the arrangement pattern of the LED assembly 1.

When the number of light emitting diodes 11 disposed above the optical axis of the cover lens 3 is made larger than the number of the light emitting diodes 11 disposed below the optical axis, for example, the second light intensity distribution pattern of a collective light source has a light intensity distribution that is stronger in the lower portion.

To sum up, the luminous intensity distribution pattern of the LED lamp formed by combining the LED assembly 1 and the cover lens 3 in this embodiment is the luminous intensity distribution pattern formed by synthesizing the first light intensity distribution pattern of collective light source formed by the arrangement pattern of the LED assembly 1 and the first prisms 31, and the second light intensity distribution pattern of a collective light source formed by the arrangement pattern of the LED assembly 1 and the second prisms 32. Thus, the luminous intensity distribution pattern of the LED lamp of this embodiment is achieved by combining (1) the arrangement pattern of the plurality of light emitting diodes 11, (2) the assembly of the plurality of first prisms 31, and (3) the assembly of the plurality of second prisms 32.

(Distance Between the Cover Lens 3 and the LED Assembly 1)

In the present invention, the distance between the cover lens 3 and the LED assembly 1 is not restricted by the fact that the particular cover lens 3 and the LED assembly 1 are used. However, the distance is preferably set within a range described below in consideration of the directivity characteristic of the light emitting diode and the required size of the LED lamp.

Figure 7:
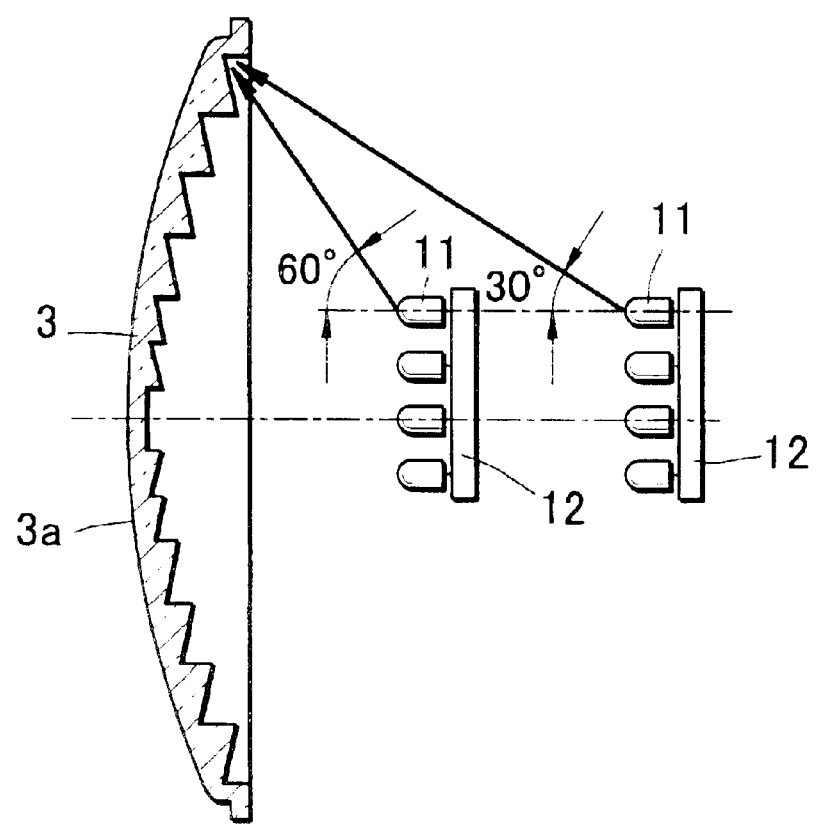
FIG. 7 schematically shows the relative positions of the LED assembly 1 and a cover lens 3 of this embodiment.

As shown in FIG. 7, it is preferable to set the distance between the cover lens 3 and the LED assembly 1 such that the angle between the line that connects the light emitting diode 11 located at the outermost position of the LED assembly 1 and the periphery of the cover lens 3 on the inner surface thereof, and the central axis of the cover lens 3 is not larger than 60° C. This is because an angle larger than 60° C. leads to insufficient intensity of light incident on a part located away from the center of the cover lens 3 due to the directivity characteristic of the light emitting diode, thus making it impossible to achieve uniform planar light emission (as the periphery of the cover lens darkens), resulting in lower efficiency of light emission.

It is also preferable to set the distance between the cover lens 3 and the LED assembly 1 such that the angle between the line that connects the light emitting diode 11 located at the outermost position of the LED assembly 1 and the periphery of the cover lens 3 on the inner surface thereof, and the central axis of the cover lens 3 is 30° C. or larger. This is because an angle smaller than 30° C. increases the light collecting power but leads to a greater burden of diffusing light imposed on the cover lens, thus resulting in lower efficiency of light emission and a larger profile of the LED lamp.

When the LED lamp is used outdoors in such an application as a traffic signal, there may arise such a case as sunlight is reflected in the outer surface of the cover lens resulting in decreasing contrast when illuminated. In order to mitigate the reflection of sunlight, the outer surface of the cover lens is preferably formed as a spherical surface having a radius of curvature not larger than 500 mm. Forming the outer surface with this curvature also allows it to suppress the height of cut in the prisms and improve the efficiency of light emission.

Since the LED lamp of this embodiment described above is constituted from a combination of the LED assembly 1 comprising the plurality of light emitting diodes disposed in the predetermined arrangement pattern and the cover lens 3 having the plurality of prisms 30, a desired luminous intensity distribution pattern can be achieved with a simple construction. Although the predetermined luminous intensity distribution pattern is formed by using the cover lens 3 having prisms 30 that comprise the set of first prisms 31 and the set of second prisms 32 formed on the inner surface thereof in a regular pattern and the LED assembly 1 comprising the plurality of light emitting diodes disposed in the predetermined arrangement in the preferred embodiment described above, the present invention is not limited to this constitution and may be implemented with various modifications as follows.

Variation 1

While the predetermined luminous intensity distribution pattern is formed by using the first prisms 31, the second prisms 32, and the LED assembly 1 that comprises the plurality of light emitting diodes disposed in the predetermined arrangement in the embodiment described above, the present invention may also be embodied by using only the plurality of first prisms 31 constituted similarly to the above embodiment, thereby forming the predetermined luminous intensity distribution pattern. For example, a relatively simple luminous intensity distribution pattern that is required to concentrate light with high intensity around the optical axis of the cover lens can be achieved only by means of the plurality of first prisms 31 as shown in FIG. 4. In this case, the arrangement of the light emitting diodes in the LED assembly may be simple, such as concentric circles.

Variation 2

Similarly, the present invention may also be embodied by using only the plurality of second prisms 31 constituted similarly to the above embodiment, thereby forming the predetermined luminous intensity distribution pattern. For example, a relatively simple luminous intensity distribution pattern that is required to concentrate light with high intensity in the lower portion can be achieved only by means of the plurality of second prisms 31 as shown in FIG. 5. In this case, the arrangement of the light emitting diodes in the LED assembly may be simple, such as concentric circles.

Variation 3

Moreover, the present invention may also be embodied by using only the first prisms 31 and the second prisms 32 constituted similarly to the above embodiment, thereby forming the predetermined luminous intensity distribution pattern. In this case, the arrangement of the light emitting diodes in the LED assembly may be simple, such as concentric circles.

INDUSTRIAL APPLICABILITY

According to the present invention as described in detail above, it is possible to provide an LED lamp that is capable of achieving a desired luminous intensity distribution characteristic and producing uniform planar light emission. Therefore, traffic signals, information display apparatuses or the like that are capable of achieving a desired luminous intensity distribution characteristic and producing uniform planar light emission can be made by using this led lamp.

What is claimed is:

1. An LED lamp comprising:
    a plurality of light emitting diodes;
    a cover lens having an inner surface with a plurality of prisms, said light emitting diodes and said cover lens being arranged so that each of said prisms receives light emitted by each of said light emitting diodes, each of said prisms being shaped and arranged to emit light received from said light emitting diodes in a substantially identical luminous intensity distribution pattern.

2. The LED lamp of claim 1, wherein a direction of the light emitted by each of said prisms in a vertical plane with respect to said cover lens is based on an orientation of an incident surface of each of said prisms, and a diffusion of the light emitted by each of said prisms in a horizontal plane with respect to said cover lens is based on a shape of said incident surface of each of said prisms.

3. The LED lamp of claim 1, wherein said cover lens has a spherical external surface with a radius of curvature of no greater than 500 mm.

4. The LED lamp of claim 1, wherein said light emitting diodes and said cover lens are arranged so that an angle between a line connecting one of said light emitting diodes located at an outermost position with respect to a central axis of said cover lens with an inner surface of a periphery of said cover lens, and the central axis of said cover lens is in a range of 30° to 60°.

5. The LED lamp of claim 1, wherein said plurality of prisms comprises a plurality of first prisms, each of said first prisms being shaped and arranged to emit light received from said light emitting diodes in a substantially identical first luminous intensity distribution pattern, said inner surface further having a plurality of second prisms, each of said second prisms being shaped and arranged to emit light received from said light emitting diodes in a substantially identical second luminous intensity distribution pattern.

6. The LED lamp of claim 5, wherein said first prisms and said second prisms are arranged in pairs, each pair consisting of one of said first prisms and one of said second prisms, said pairs being arranged on said inner surface of said cover lens according to a rule.

7. The LED lamp of claim 5, wherein said first prisms and said second prisms are oriented so that said second prisms emit light in a direction below a direction of light emitted from said first prisms.

8. The LED lamp of claim 5, wherein a direction of the light emitted by each of said second prisms in a vertical plane with respect to said cover lens is based on an orientation of an incident surface of each of said second prisms, and a diffusion of the light emitted by each of said second prisms in a horizontal plane with respect to said cover lens is based on a shape of said incident surface of each of said second prisms.

9. The LED lamp of claim 8, wherein a direction of the light emitted by each of said first prisms in a vertical plane with respect to said cover lens is based on an orientation of an incident surface of each of said first prisms, and a diffusion of the light emitted by each of said first prisms in a horizontal plane with respect to said cover lens is based on a shape of said incident surface of each of said first prisms.

10. The LED lamp of claim 5, wherein said light emitting diodes are arranged based on a required overall luminous intensity distribution pattern for said LED lamp.

11. The LED lamp of claim 10, wherein said light emitting diodes are arranged so that no more than 40% of a total number of said light emitting diodes are located below a horizontal plane that includes a central axis of said cover lens.

12. The LED lamp of claim 11, wherein said light emitting diodes and said cover lens are arranged so that an angle between a line connecting one of said light emitting diodes located at an outermost position with respect to the central axis of said cover lens with an inner surface of a periphery of said cover lens, and the central axis of said cover lens is in a range of 30° to 60°.

* * * * *